(12) United States Patent
Faulkner

(10) Patent No.: US 10,184,689 B2
(45) Date of Patent: Jan. 22, 2019

(54) FAULT DETECTING CIRCUITS FOR ELECTRIC HEATERS, PIPE HEATERS AND PIPE HEATING SYSTEMS INCLUDING FAULT DETECTING CIRCUITS AND METHODS OF INDICATING THAT AN ELECTRICAL ENERGY SUPPLY TO AN ELECTRIC RESISTANCE HEATER HAS BEEN INTERRUPTED

(71) Applicant: EDWARDS VACUUM LLC, Sanborn, NY (US)

(72) Inventor: Budd Edward Faulkner, Hillsboro, OR (US)

(73) Assignee: Edwards Vacuum LLC, Sanborn, NY (US)

( * ) Notice: Subject to any disclaimer, the term of this patent is extended or adjusted under 35 U.S.C. 154(b) by 544 days.

(21) Appl. No.: 14/813,251

(22) Filed: Jul. 30, 2015

(65) Prior Publication Data
US 2017/0034873 A1    Feb. 2, 2017

(51) Int. Cl.
*F24H 9/18*    (2006.01)
*H02H 5/04*    (2006.01)
(Continued)

(52) U.S. Cl.
CPC .............. *F24H 9/18* (2013.01); *F24H 9/06* (2013.01); *F24H 9/12* (2013.01); *F24H 9/20* (2013.01);
(Continued)

(58) Field of Classification Search
CPC ..... F24H 9/18; F24H 9/06; F24H 9/12; F24H 9/20; F24H 9/124; F24H 9/128;
(Continued)

(56) References Cited

U.S. PATENT DOCUMENTS

2008/0283516 A1* 11/2008 Talle .............. F24D 19/1096
                                                    219/490
2009/0179022 A1    7/2009 Ellis
2017/0030503 A1    2/2017 Faulkner et al.

FOREIGN PATENT DOCUMENTS

JP           09092473     *   4/1997

OTHER PUBLICATIONS

Edwards Limited (2013), TMS Temperature Management System Instruction Manual, Issue E, pp. 1-72, Crawley, United Kingdom.
Office Action dated Dec. 12, 2017 for U.S. Appl. No. 14/813,223.

* cited by examiner

*Primary Examiner* — Shawntina Fuqua
(74) *Attorney, Agent, or Firm* — Westman, Champlin & Koehler, P.A.; Theodore M. Magee

(57) ABSTRACT

A fault indicating circuit for an electric heater has a first branch to conduct a supply of electrical ,energy to the electrical heater and includes a temperature sensitive device to interrupt the supply of electrical energy to the electric heater when exposed to a temperature exceeding a set temperature. The fault detecting circuit has a second branch that includes at least an element of a fault indicating device. The first branch has a first resistance $R_1$, the second branch has a second resistance $R_2$ and the two branches are, electrically in parallel. The first and second resistances $R_1$, $R_2$ are such that when, in use, the temperature sensitive device operates to allow : electrical energy to flow through the first branch and the fault indicating device is inactive and when the temperature sensitive device operates to interrupt that supply of electrical energy the fault indicating device activates to indicate that the temperature sensitive device has operated to interrupt the supply of electrical energy to the electric heater.

21 Claims, 5 Drawing Sheets

(51) Int. Cl.
*F24H 9/06* (2006.01)
*F24H 9/12* (2006.01)
*F24H 9/20* (2006.01)
*G01R 31/00* (2006.01)
*H05B 1/02* (2006.01)

(52) U.S. Cl.
CPC ............... *G01R 31/00* (2013.01); *H02H 5/04* (2013.01); *H02H 5/042* (2013.01); *H05B 1/0233* (2013.01)

(58) Field of Classification Search
CPC .... F24H 9/2007; F24H 9/2014; F24H 9/2021; F24H 9/2028; G01R 31/00; H02H 5/04; H02H 5/042; H05B 1/0233; H05B 1/0291
See application file for complete search history.

FAULT DETECTING CIRCUITS FOR ELECTRIC HEATERS, PIPE HEATERS AND PIPE HEATING SYSTEMS INCLUDING FAULT DETECTING CIRCUITS AND METHODS OF INDICATING THAT AN ELECTRICAL ENERGY SUPPLY TO AN ELECTRIC RESISTANCE HEATER HAS BEEN INTERRUPTED

FIELD OF THE INVENTION

The present invention is directed to fault detecting circuits for electric heaters, pipe heaters and pipe heating systems including fault detecting circuits and methods of indicating that an electrical energy supply to an electric resistance heater has been interrupted.

BACKGROUND

Many industrial processes require the use of pipes to convey fluids between fluid reservoirs, machines, processing devices and the like. Control of the temperature within the pipe may be desirable. This may be to ensure that the fluids conveyed are maintained in a particular state. For example, processes used in the manufacture of semiconductors may involve the use of gases that can become dangerous if allowed to condense in the pipes through which they are conveyed. Explosion hazards, corrosive media and other such hazards may exist if such gases are allowed to condense on the pipe walls. Pipes may be provided with electric heaters to warm the pipe walls to prevent condensation of the conveyed gases. Often numerous electric heaters are provided along a length of pipe.

Known heaters may be secured to a pipe by means of straps that wrap around the heater and the pipe. In some embodiments, one end of a strap is provided with two D-rings through which the other end of the strap can be threaded to tighten the strap and secure the heater to the pipe.

It is useful to be able to detect when an electric pipe heater has failed.

Other objects, aspects and advantages of this invention will be apparent to one skilled in the art in view of the following disclosure, the drawings, and the appended claims.

SUMMARY OF THE INVENTION

The summary of the invention is intended to introduce the reader to various exemplary aspects of the invention. Particular aspects of the invention are shown in other sections herein below, and the invention is set forth in the appended claims which alone demarcate its scope.

In accordance with an exemplary embodiment of the invention a fault detecting circuit for an electric heater comprises: (a) a first branch to conduct a supply of electrical energy to energise said electric heater and Comprising a temperature sensitive device to interrupt said supply of electrical energy when said temperature sensitive device is exposed to a temperature exceeding a set temperature; and (b) a second branch comprising at least an element of a fault indicating device, wherein said first branch has a first resistance $R_1$, said second branch has a second resistance $R_2$ and said first and second branches are electrically in parallel, and wherein said first and second resistances $R_1$, $R_2$ are such that, in use, when said temperature sensitive device operates to allow said supply of electrical energy to flow through said first branch said fault indicating device is inactive and when said temperature sensitive device operates to interrupt said supply of electrical energy through said first branch said fault indicating device activates to indicate that said temperature sensitive device has operated to interrupt said supply of electrical energy to said electric heater.

An additional aspect of the invention provides a pipe heater comprising: (a) an electric heater; and (b) a fault detecting circuit, wherein said fault detecting circuit comprises: (i) a first branch to be placed in series with said electric heater to conduct a supply of electrical energy for said electric heater arid comprising a temperature sensitive device to interrupt said supply of electrical energy through said first branch when said temperature sensitive device is exposed to a temperature exceeding a set temperature; and (ii) a second branch comprising a lighting element, and wherein said first branch has a first resistance $R_1$, said second branch has a second resistance $R_2$ and said first and second branches are electrically in parallel, and wherein said second resistance $R_2$ is greater than said first resistance $R_1$ such that, in use, when said temperature sensitive device operates to allow said supply of electrical energy to flow through said first branch there is an insufficient electrical energy flow in said second branch to cause said lighting element to illuminate and when said temperature sensitive device operates to interrupt said supply of electrical energy through said first branch, there is a sufficient electrical energy flow in said second branch to cause said lighting element to illuminate to indicate that said supply of electrical energy through said first branch has been interrupted.

A further aspect of the invention provides a pipe heating system comprising: (a) an electric heater; and (b) a fault indicating circuit for said electric heater, wherein said electric heater comprises at least one resistance heating element, wherein said fault indicating circuit is electrically in series with Said electric heater and comprises: (i) a first branch having a first resistance $R_1$ and including a temperature sensitive device having a first condition in which electrical current is permitted to flow through said first branch and a second condition in which electrical current is prevented from flowing through said first branch, and (ii) a second branch having a second resistance $R_2$ and including at least an element of a fault indicating device, wherein said first branch is electrically in parallel with said second branch, and wherein said first resistance $R_1$ and said second resistance $R_2$ are such that when said temperature sensitive device is in said first condition second branch receives insufficient electrical power to cause activation of said fault indicating device and when said temperature sensitive device is in said second condition said second branch receives sufficient power to cause activation of said fault indicating device to indicate that electrical current is not flowing through said first branch.

A still further aspect of the invention provides a method of indicating that an electrical energy supply to an electric resistance heater been interrupted by operation of a temperature sensitive device through which the electrical energy supply passes, said method comprising electrically connecting a lighting element to said temperature sensitive device to form a parallel circuit that is connected in series with said electric resistance heater, wherein said parallel circuit is configured such that when said temperature sensitive device is operating to allow the passage of said electrical energy supply said lighting element does not light and when said temperature sensitive device operates to interrupt said electrical energy supply the lighting element lights to indicate the interruption of said electrical energy supply.

Another aspect of the invention provides a pipe heating system comprising: (a) an electric heater; and (b) a fault indicating circuit for said electric heater, wherein said electric heater comprises at least one resistance heating element, wherein said fault indicating circuit is electrically in series with said electric heater and comprises; (i) a first branch including a temperature sensitive device having a first condition in which electrical current is permitted to flow through said first branch and a second condition in which electrical current is prevented from flowing through said first branch, (ii) a second branch including at least an element of a fault indicating device, and wherein said first branch is electrically in parallel with said second branch, and wherein when said temperature sensitive device is in said first condition permitting electric current to flow through said first branch said electric heater is in an on condition and said fault indicating device is in an inactive condition and when said temperature sensitive device is in said second condition preventing electrical current from flowing though said first branch said electric heater is in an off condition and said fault indicating device is activated to indicate that electrical current is not flowing through said first branch.

While multiple embodiments are disclosed, still other embodiments of the present invention will become apparent to those skilled in the art from the following detailed description, which shows and describes illustrative embodiments of the invention. Accordingly, the detailed description is to be regarded as illustrative in nature and not restrictive.

BRIEF DESCRIPTION OF THE DRAWINGS

In the following disclosure, reference will be made to the drawings, in which.

DETAILED DESCRIPTION OF THE PREFERRED EMBODIMENTS

So that the invention may be readily understood, certain terms are first defined.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
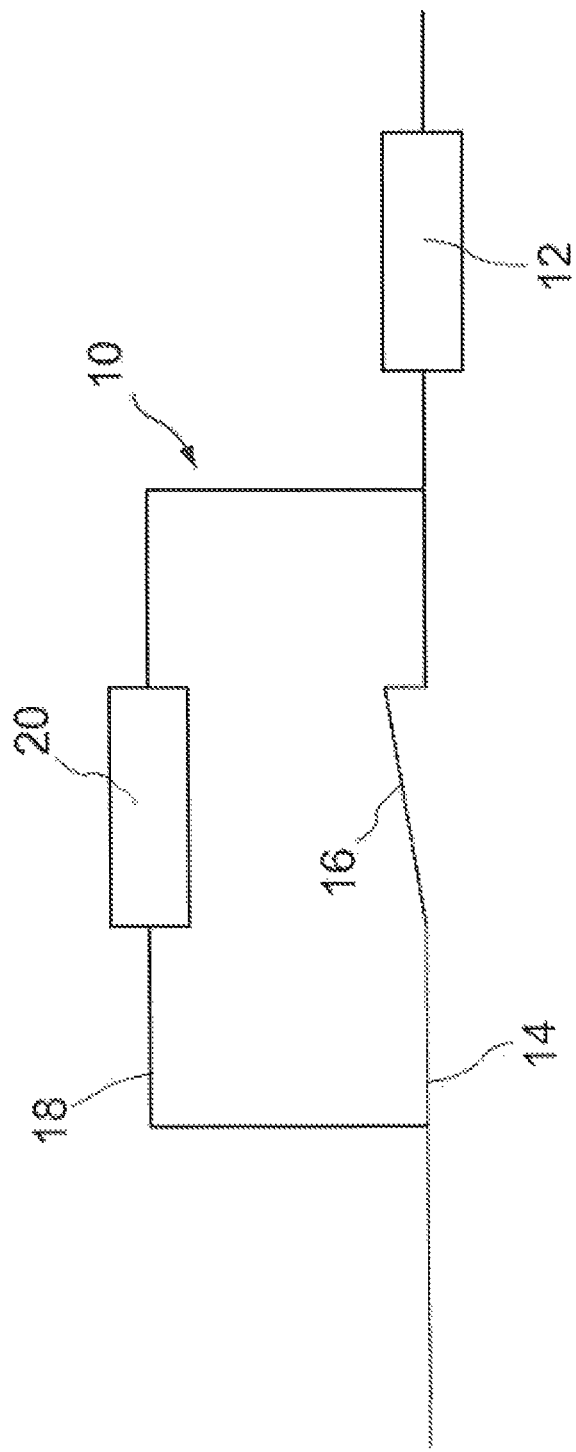
FIG. 1 is schematic illustration of a fault indicating circuit for an electric heater.

Referring to FIG. 1, a fault indicating circuit 10 for an electric heater 12 comprises a first branch 14 to conduct a supply of electrical energy to energise the electric heater and comprising a temperature sensitive device 16 to interrupt that supply of electrical energy when exposed to a temperature exceeding a predetermined temperature. The fault indicating circuit 10 further comprises a second branch 18 comprising at least an element of a fault indicating device. In the illustrated embodiment the fault indicating device is a fault indicating element in the form of a lighting element 20, which is connected into the second branch 18. The first branch 14 has a resistance $R_1$, the second branch 18 has a second resistance $R_2$ and the two branches are electrically in parallel. The relative resistances of the first and second resistances $R_1$, $R_2$ are such that when, in use, the temperature sensitive device 16 operates to allow the flow of electrical energy through the first branch, the electric heater 12 is energised and the lighting element 20 is inactive and so does not illuminate. When the temperature sensitive device 16 operates to interrupt the supply of electrical energy through the first branch 14, the lighting element 20 is activated and so lights to indicate that the supply of electrical energy to the electric heater 12 has been interrupted.

The relative resistances $R_1$, $R_2$ and arrangement of the branches 14, 18 are such that when the temperature sensitive device 16 operates to allow electrical energy to flow through the first branch 14 so that the electric heater 12 is energised, there is insufficient electrical energy flow in the second branch to cause the lighting element to light so that it remains unlit. When in, a fault situation, the temperature sensitive device 16 operates to cut off the supply of electrical energy through the first branch 14, there is sufficient electrical energy flow in the second branch to cause the lighting element 20 to activate so that it lights to provide a visual indication that the electric heater is no longer being powered. When closed the temperature sensitive device 16, which may comprise a thermostat, a thermal fuse or a thermostat and thermal fuse in series, has essentially zero resistance so that for practical purposes, the resistance $R_1$ is essentially 0Ω. Accordingly, when the temperature sensitive device 16 operates to allow electrical energy to flow through the first branch 14, there is essentially a zero voltage drop across the temperature sensitive device and all of the current flowing through the electric heater 12 flows through the first branch while there is essentially zero potential and zero current flow in the second branch 18. When the temperature sensitive device 16 operates to interrupt the flow of electrical energy through the first branch 14, the first resistance $R_1$ may be considered infinite and the lighting element 20 will essentially see the supply voltage and all of the current flowing through the electric heater 12 flows through the lighting element.

When the temperature sensitive device 16 operates to cut off the supply of electrical energy through the first branch 14, the resistance $R_2$ is effectively no longer a part of a parallel circuit and is simply in series with the electric heater 12 so that by making the resistance $R_2$ sufficiently high, it can be ensured that insufficient current flows through the second branch to power the electric heater to provide significant heat output. Thus, for practical purposes, when the temperature sensitive device 16 operates to interrupt the flow path through the first branch 14, although the second branch 18 provides a path to supply electrical energy to energise electric heater 12, for practical purposes the electric heater is switched off rendering it safe. Although not essential, it is presently preferred that the resistance $R_2$ is sufficiently high to ensure that when the first branch is opened by operation of the temperature sensitive device 16, the current flow through the electric heater 12 is limited so that the wattage supplied to the heater is only up to approximately 5% (five per cent) of the rated wattage of the heater. In one embodiment, the heating element used comprises a 1 mA, 120 VAC light that once lit allows just 1 mA to flow through the electric heater.

Figure 2:
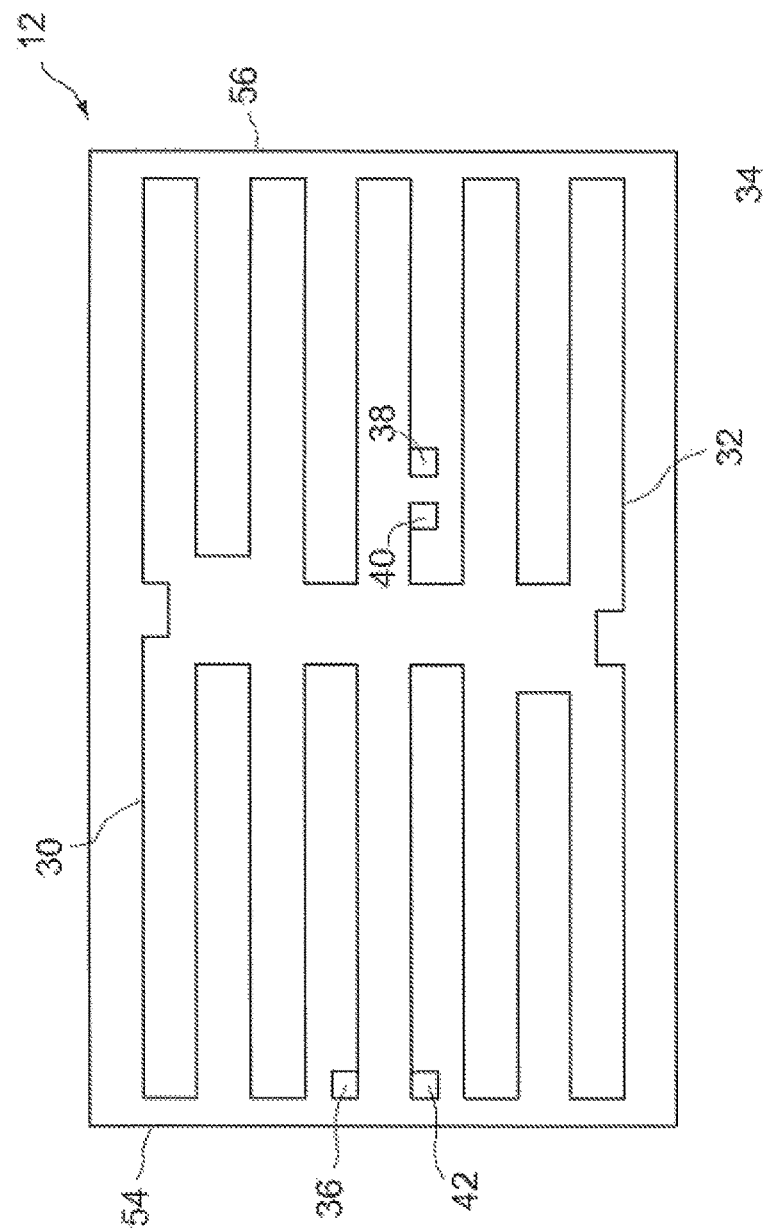
FIG. 2 is a schematic representation of an electric heater.

Referring to FIG. 2, an embodiment of an electric heater 12 comprises a plurality of resistance heating elements 30, 32 laminated between two sheets of silicone rubber 34. In FIG. 2 the uppermost (as viewed in the drawing) sheet of silicone rubber has been omitted so that the resistance heating elements 30, 32 can be seen. The resistance heating element 30 has an input (upstream) terminal 36 and an output (downstream) terminal 38. Similarly, the resistance heating element 32 has an input (upstream) terminal 40 and an output (downstream) terminal 42. Each resistance heating element 30, 32 follows a convoluted path between its input and output terminals so that the sheet of silicone rubber 34 is substantially covered by resistance heating element and so heating will be substantially uniform across the entire surface area of the electric heater 12.

Figure 3:
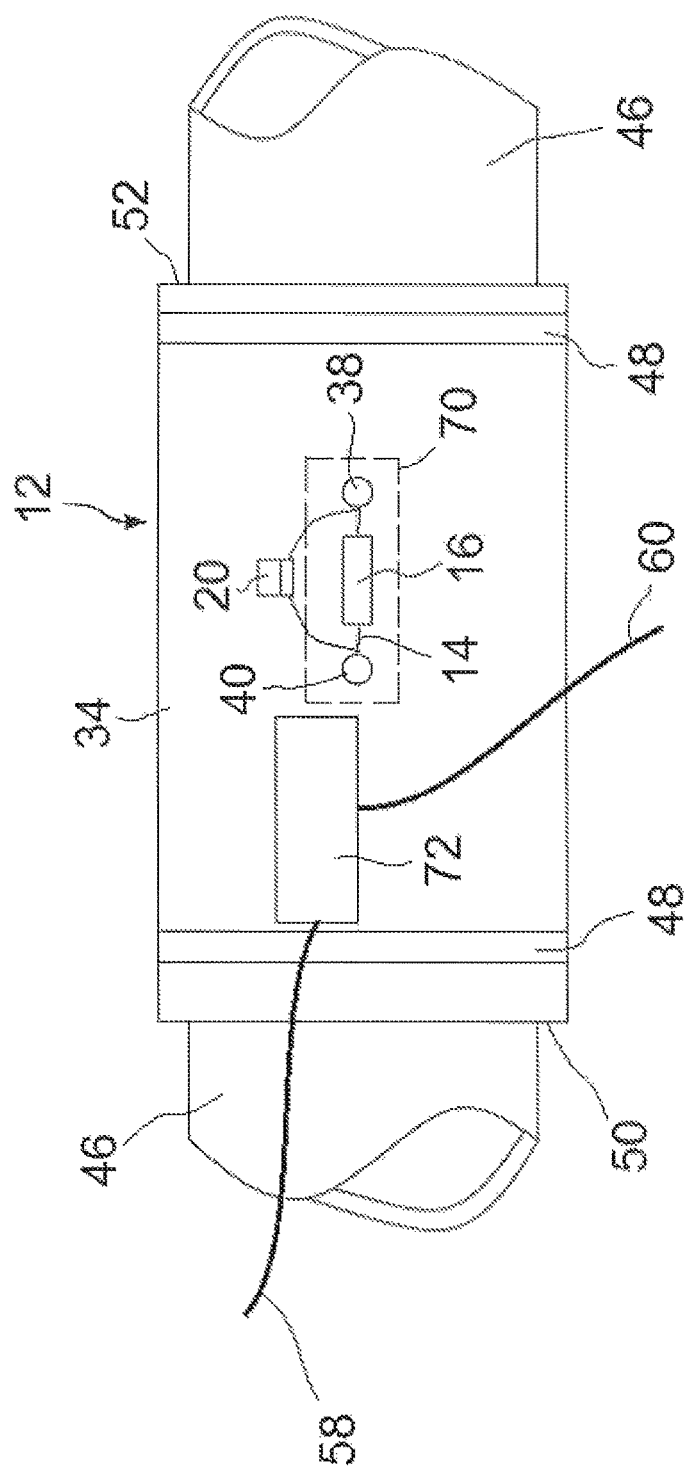
FIG. 3 is a schematic representation of a pipe heater including the electric heater of FIG. 2.
Figure 4:
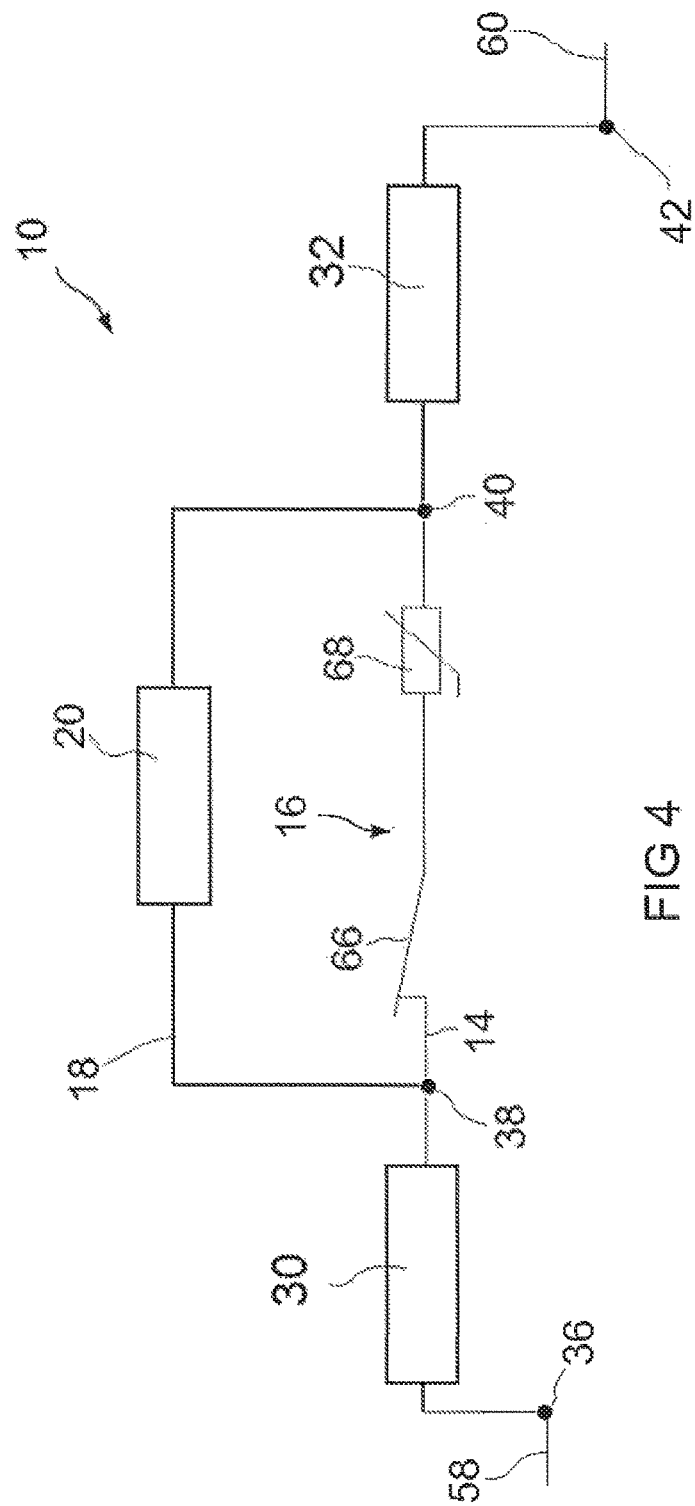
FIG. 4 is a schematic representation of an electric circuit of the pipe heater of FIG. 3.

Referring to FIGS. 3 and 4, the construction of the electric heater 12 is such that it can be wrapped around a pipe 46 so as to enclose a length of pipe as a sleeve. The electric heater 12 is provided with straps 48 to secure it to the pipe 46. Typically, the straps 48 are fitted adjacent the ends 50, 52 of the electric heater 12, which are defined by the sides 54, 56 (FIG. 2) of the sheets of silicone rubber 34. Although not limited to these examples as in principle the electric heater 12 can be configured for use with any size of pipe, the electric heater may be provided in sizes configured to enable wrapping around pipes having a diameter anywhere in the range 12 to 160 mm and in different lengths. In some embodiments instead of using straps 48 as show in FIG. 3, the electric heater 12 may be secured to a pipe, valve or the like in a pipe system using one or more securing systems as described in the Applicant's co-pending patent application titled 'Securing Pipe Heaters and Pipe Insulation to Pipe Systems' (Applicant's Case Reference: M14A203), the entire content of which is incorporated herein by reference.

One of the sheets of silicone rubber 34 is apertured so that the terminals 36-42 are exposed at the outer surface of the electric heater 12. Power leads 58, 60 are secured to the terminals 36, 42 to electrically connect the electric heater 12 with a source of electrical energy. The electrical energy source may be a single or 3-phase mains electricity supply that may be suitably conditioned upstream of the electric heater.

The temperature sensitive device 16 may comprise a heat sensitive switch, such as a thermostat 66, or a thermal fuse 68. As shown in FIG. 4, in some embodiments the temperature sensitive device 16 may comprise a thermostat 66 and thermal fuse 68 in series. The temperature sensitive device 16 is secured to the terminals 38, 40 to electrically connect the temperature sensitive device with the electric heater 12 between the two resistance heating elements 30, 32. The lighting element 20 is connected with the temperature sensitive device 16 between the terminals 38, 40 so as to be electrically in parallel with the temperature sensitive device. An electrically insulating patch 70 (shown in dashed lines) may be secured over the terminals 38, 40 so as to cover the terminals and temperature sensitive device while leaving the lighting element 20 exposed. The insulating patch 70 may be made of silicone rubber. A similar electrically insulating patch 72 may be secured over the terminals 36, 42. The electrically insulating patches may be secured to the electric heater 12 by means of an adhesive, bonding agent, strapping or the like.

Figure 5:
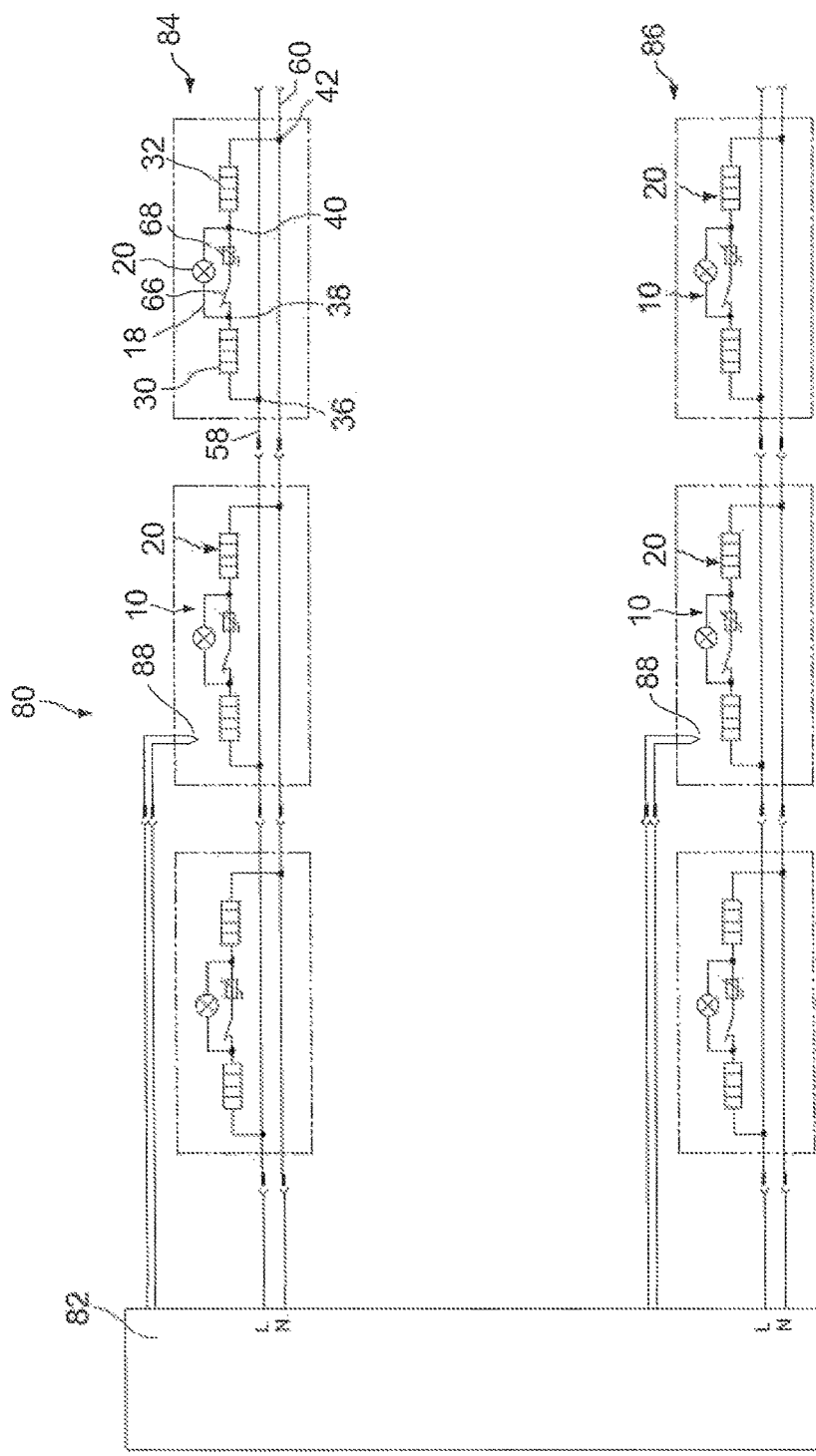
FIG. 5 is a schematic representation of a pipe heating system including a plurality of pipe heaters.

As illustrated in FIG. 5, a pipe heating system 80 may comprise a plurality of electric heaters 12 with respective fault indicating circuits 10 fitted to a pipe or pipes (not shown). The pipe heating system 80 may further comprise a power supply and controller, which may be integrated into a single power supply and controller unit 82. The electric heaters 12 may be operated in groups 84, 86 controlled to heat specific zones on the pipe or pipes. In the illustrated embodiment, two groups 84, 86 of three electric heaters 12 are shown. The electric heaters 12 of each group 84, 86 are connected electrically in parallel so that if one heater in the group fails, the other heaters can continue to function. The groups 84, 86 of electric heaters may be temperature controlled by controlling the amount of electrical energy supplied by the power supply and control unit 82 in response to temperature indicating signals provided by a transducer 88. The transducer 88 may be a temperature sensor such as a thermocouple.

It is to be understood that the heating system 80 may comprise more than two groups 84, 86 of electric heaters 12 and that each group may comprise more than three electric heaters. In some embodiments, the power supply and controller unit 82 may be configured as a 208 VAC 3-phase device outputting Lip to 30 A and having nine outputs to supply nine groups of electric heaters consuming up to 1200 watts per group.

In use, if the thermostat 66 or thermal fuse 68 of the fault indicating circuit 10 of one of the electric heaters 12 of the pipe heating system 80 operates to open the respective branch 14, the associated lighting element 20 will light making it easy to identify which heater of the numerous heaters of the groups 84, 86 is no longer being powered and while current continues to flow through the electric heater 12 via the lighting element, the level of the current is so low that the heater effectively switched off and safe, pending diagnosis of the fault and replacement or repair of the heater.

In the illustrated embodiments, the fault indicating device is a fault indicating element provided in the second branch and is powered by electrical energy flowing through the second branch. In the illustrated embodiments the fault indicating element is a lighting element. While not currently preferred, it is envisaged that an audio output device may be used as the fault indicating element. In other embodiments, the fault indicating device may comprise a relay provided in the second branch and a fault indicating element that is powered by an electrical supply that is switched by the relay. In such embodiments, the relay is open when the temperature sensitive device operates to allow electrical energy to flow through the first branch and closes when the temperature sensitive device operates to interrupt the flow of electrical energy through the first branch.

In the illustrated embodiment the branch 18 comprises a resistance $R_2$ that is determined by the resistance of the fault indicating element. In cases in which the resistance of a standard fault indicating element does not correspond to a desired resistance $R_2$, a suitable resistance may be incorporated in the branch 18 in series with the fault indicating element to provide an equivalent resistance $R_E$ that at least approximates to the desired resistance $R_2$.

It will be understood that the configuration of the fault indicating circuits described are such that when the temperature sensitive device operates to allow the passage of electrical energy, the branch containing the second branch and fault indicating clement are for practical purposes not in the circuit (inactive) and when the temperature sensitive device operates to interrupt the flow of electrical energy through the first branch, the first branch is not in the circuit (inactive). In effect, for practical purposes, when the temperature sensitive device allows current flow through the first branch, all of the current flowing in the fault indicating circuit flows through the first branch and when the temperature sensitive device interrupts the flow of current through the first branch, all of the current flow through the fault indicating circuit flows through the second branch. By suitable selection of the resistance in the second branch, it can be ensured that when the second branch is active, the supply of electrical energy to the electric heater is not sufficient to provide a significant heat output and so for practical purposes the electric heater is switched off by operation of the temperature sensitive device.

It will be understood that the fault indicating circuits described allow the provision of a simple and easy to identify indication that the power supply to an electric heater has been interrupted by a temperature sensitive device that has opened in response to an over temperature situation. The fault indicating element used may be a standard component that does not have to be matched to the temperature at which the temperature sensitive device operates to interrupt the power supply. Additionally, the use of a fault indicating element as described allows the use of a low cost component in a low cost circuit modification as compared with using a thermocouple or resistance temperature detector (RTD) connected to a controller as a means of providing an alert.

The electric heater 12 illustrated in FIG. 2 is given purely by way of example. It is to be understood that the fault indicating circuits described and the methodology they embody are not limited to use with such an electric heater and may be used with other variations of electric heaters. The fault detecting circuits may, for example, be used with nickel chromium wounding heating elements in silicone or fabric, or trace elements in polymide sheets.

In the illustrated embodiment, the fault indicating element 20 is shown disposed relatively close to the temperature sensitive device 16 and terminals 38, 40 so that in use the fault indicating element would lie on the electric heater 12. It is to be understood that this is not essential and in principle wires could be brought out from the terminals 38, 40 so that the fault indicating element could be disposed at a remote location. For example, the fault indicating element may be mounted in a panel or on a controller. In installations utilising multiple electric heaters with fault indicating elements located remote from the heaters, the panel, controller or the like, may be marked or different colour lighting elements used to enable identification of the heater associated with a fault indicating element that has activated.

It will be understood that the described embodiments provide a fault indicating circuit that has electrically parallel first and second branches and that in use the first branch switches between a first condition in which the branch resistance is substantially zero and substantially all of the current flowing through an associated electric heater flows through that branch and there is no, or insufficient current flow, in the second branch to cause a fault indicating element to activate and a second condition in which the branch resistance is for practical purposes infinite and all of the current that would otherwise have flown through the first branch flows through the second branch causing the fault indicating element to activate and that there is sufficient branch resistance in the second branch for the current flow through the second branch to be insufficient for the electric heater to provide a significant heater output so that for practical purposes the electric heater is in an off condition when the first branch is in its second condition and this is indicated by the activation of the fault indicating element.

Many modifications and variations of the invention as hereinbefore set forth can be made without departing from the spirit and scope thereof, and, therefore, only such limitations should be imposed as are indicated by the appended claims.

What is claimed:

1. A fault detecting circuit for an electric heater, said fault detecting circuit comprising:
    (a) a first branch to conduct a supply of electrical energy to energise said electric heater and comprising a temperature sensitive device to interrupt said supply of electrical energy when said temperature sensitive device is exposed to a temperature exceeding a set temperature; and
    (b) a second branch comprising at least an element of a fault indicating device,
    wherein said first branch has a first resistance $R_1$, said second branch has a second resistance $R_2$ and said first and second branches are electrically in parallel, and
    wherein said first and second resistances $R_1$, $R_2$ are such that, in use, when said temperature sensitive device operates to allow said supply of electrical energy to flow through said first branch said fault indicating device is inactive and when said temperature sensitive device operates to interrupt said supply of electrical energy through said first branch said fault indicating device activates to indicate that said temperature sensitive device has operated to interrupt said supply of electrical energy to said electric heater.

2. A fault detecting circuit as claimed in claim 1, wherein said temperature sensitive device comprises at least one of a thermal fuse and a heat sensitive switch.

3. A fault detecting circuit as claimed in claim 1, wherein said at least an element of a fault indicating device is a lighting element and when activated, said lighting element is lit.

4. A fault indicating circuit as claimed in claim 1, wherein said first resistance $R_1$ is less than said second resistance $R_2$.

5. A fault indicating circuit as claimed in claim 1, wherein said fault indicating circuit is for a said electric heater having a rated wattage and said second resistance $R_2$ is such that the electrical energy supplied through said second branch when said temperature sensitive device operates to interrupt said supply of electrical energy through said first branch is equal to or less than 5% of said rated wattage.

6. A fault indicating circuit as claimed in claim 1, wherein when said temperature sensitive device operates to allow said supply of electrical energy to flow through said first branch said first resistance $R_1$ is substantially zero and when said temperature sensitive device operates to interrupt said supply of electrical energy through said first branch said first resistance $R_1$ is an electrically infinite resistance.

7. A pipe heater comprising:
    (a) an electric heater; and
    (b) a fault detecting circuit,
    wherein said fault detecting circuit comprises:
        (i) a first branch to be placed in series with said electric heater to conduct a supply of electrical energy for said electric heater and comprising a temperature sensitive device to interrupt said supply of electrical energy through said first branch when said temperature sensitive device is exposed to a temperature exceeding a set temperature; and
        (ii) a second branch comprising a lighting element, and
    wherein said first branch has a first resistance $R_1$, said second branch has a second resistance $R_2$ and said first and second branches are electrically in parallel, and
    wherein said second resistance $R_2$ is greater than said first resistance $R_1$ such that, in use, when said temperature sensitive device operates to allow said supply of electrical energy to flow through said first branch there is an insufficient electrical energy flow in said second branch to cause said lighting element to illuminate and when said temperature sensitive device operates to interrupt said supply of electrical energy through said first branch, there is a sufficient electrical energy flow in said second branch to cause said lighting element to illuminate to indicate that said supply of electrical energy through said first branch has been interrupted.

8. A pipe heater as claimed in claim 6, further comprising a mounting operable to secure said electric heater to a pipe so that said electric heater can heat said pipe.

9. A pipe heater as claimed in claim 6, wherein said electric heater has a rated wattage and said second resistance $R_2$ is such that the electrical energy supplied through said second branch when said temperature sensitive device operates to interrupt said supply of electrical energy through said first branch is equal to or less than 5% of said rated wattage.

10. A pipe heater as claimed in claim 6, wherein said temperature sensitive device comprises at least one of a thermal fuse and a heat sensitive switch.

11. A pipe heater as claimed in claim 6, wherein said electric heater comprises a plurality of resistance heating elements and said fault indicating circuit is electrically connected between and in series with a first of said resistance heating elements and a second of said resistance heating elements.

12. A pipe heating system comprising:
(a) an electric heater; and
(b) a fault indicating circuit for said electric heater,
wherein said electric heater comprises at least one resistance beating element,
wherein said fault indicating circuit is electrically in series with said electric heater and comprises:
(i) a first branch having a first resistance $R_1$ and including a temperature sensitive device having a first condition in which electrical current is permitted to flow through said first branch and a second condition in which electrical current is prevented from flowing through said first branch, and
(ii) a second branch having a second resistance $R_2$ and including at least an element of a fault indicating device,
wherein said first branch is electrically in parallel with said second branch, and
wherein said first resistance $R_1$ and said second resistance $R_2$ are such that when said temperature sensitive device is in said first condition second branch receives insufficient electrical power to cause activation of said fault indicating device and when said temperature sensitive device is in said second condition said second branch receives sufficient power to cause activation of said fault indicating device to indicate that electrical current is not flowing through said first branch.

13. A pipe heating system as claimed in claim 12, comprising a plurality of said electric heaters and respective said fault indicating circuits for said electric heaters.

14. A pipe heating system as claimed in claim 13, further comprising a controller for said electric heaters, wherein said electric heaters are arranged in groups that each comprise a plurality of electric heaters and said groups are separately connected with said controller.

15. A pipe heating system as claimed in claim 14, further comprising an electrical power supply for said electric heaters and respective transducers associated with said groups of electric heaters, wherein said controller controls the electrical power supplied from said electrical power supply to each said group of electric heaters in accordance with signals received from the respective transducers.

16. A pipe heating system as claimed in claim 12, wherein said electric heater has a rated wattage and said second resistance $R_2$ is such that the electrical energy supplied through said second branch when said temperature sensitive device operates to interrupt said supply of electrical energy through said first branch is equal to or less than 5% of said rated wattage.

17. A pipe beating system as claimed in claim 12, wherein said temperature sensitive device comprises at least one of a thermal fuse and a heat sensitive switch.

18. A pipe heating system as claimed in claim 12, wherein said fault indicating circuit is disposed upstream of said electric heater or downstream of said electric heater.

19. A pipe heating system as claimed in claim 12, wherein said electric heater comprises a plurality of resistance heating elements and said fault indicating circuit is electrically connected in series between a first of said resistance heating elements and a second of said resistance heating elements.

20. A method of indicating that an electrical energy supply to an electric resistance heater been interrupted by operation of a temperature sensitive device through which the electrical energy supply passes, said method comprising electrically connecting a lighting element to said temperature sensitive device to form a parallel circuit that is connected in series with said electric resistance heater, wherein said parallel circuit is configured such that when said temperature sensitive device is operating to allow the passage of said electrical energy supply said lighting element does not light and when said temperature sensitive device operates to interrupt said electrical energy supply the lighting element lights to indicate the interruption of said electrical energy supply.

21. A pipe heating system comprising:
(a) an electric heater; and
(b) a fault indicating circuit for said electric heater,
wherein said electric heater comprises at least one resistance heating element,
wherein said fault indicating circuit is electrically in series with said electric heater and comprises;
(i) a first branch including a temperature sensitive device having a first condition in which electrical current is permitted to flow through said first branch and a second condition in which electrical current is prevented from flowing through said first branch,
(ii) a second branch including at least an element of a fault indicating device, and
wherein said first branch is electrically in parallel with said second branch, and
wherein when said temperature sensitive device is in said first condition permitting electric current to flow through said first branch said electric heater is in an on condition and said fault indicating device is in an inactive condition and when said temperature sensitive device in said second condition preventing electrical current from flowing though said first branch said electric heater is in an off condition and said fault indicating device is activated to indicate that electrical current is not flowing through said first branch.

* * * * *